US007244968B2

(12) United States Patent
Yoo

(10) Patent No.: US 7,244,968 B2
(45) Date of Patent: Jul. 17, 2007

(54) GAN-BASED SEMICONDUCTOR JUNCTION STRUCTURE

(75) Inventor: Tae-Kyung Yoo, Yongin-si (KR)

(73) Assignees: Epivalley Co., Ltd., Kyunggi-do (KR); Samsung Electro-Mechanics Co., Ltd., Kyungki-do (KR)

( * ) Notice: Subject to any disclaimer, the term of this patent is extended or adjusted under 35 U.S.C. 154(b) by 0 days.

(21) Appl. No.: 10/559,256

(22) PCT Filed: Jun. 3, 2004

(86) PCT No.: PCT/KR2004/001317

§ 371 (c)(1),
(2), (4) Date: Dec. 2, 2005

(87) PCT Pub. No.: WO2004/112156

PCT Pub. Date: Dec. 23, 2004

(65) Prior Publication Data

US 2006/0118914 A1 Jun. 8, 2006

(30) Foreign Application Priority Data

Jun. 3, 2003 (KR) ...................... 10-2003-0035816

(51) Int. Cl.
*H01L 33/00* (2006.01)

(52) U.S. Cl. ........................ 257/101; 257/102; 257/103

(58) Field of Classification Search ........... 257/96–103
See application file for complete search history.

(56) References Cited

U.S. PATENT DOCUMENTS 6,895,029 B2 * 5/2005 Hanaoka .................. 372/45.01
RE38,805 E * 10/2005 Ohba et al. ................. 257/103
7,119,271 B2 * 10/2006 King et al. ................. 136/252

OTHER PUBLICATIONS

J.J. Wierer, etc, "Buried tunnel contact junction AlGaAs-GaAs-InGaAs quantum well heterostructure lasers with oxide-defined lateral current", Oct. 1997, Appl. Phys. Lett. 71(16), pp. 2286-2288.

T.A. Richard, etc , "High current density carbon-doped strained-layer GaAs(P+)- InGaAs(n+)-GaAs(n+) p-n tunnel diodes.", Dec. 1993, Appl. Phys. Lett, 63(26).

Seong-Ran Jeon, etc., "Lateral current spreading in GaN-based LED utilizing tunnel contact junctions", May 21, 2001., Appl. Phys. Lett. vol. 78, 21, 3265-3267.

Chih-Hsin Ko, etc, "P-dwon InGaN/GaN Multiple Quantum Wells Light emitting diode structure grown by metal-organic vapor phase epitaxy", Jpn. J. Appl. Phys. vol. 41, Apr. 2002, pp. 2489-2492.

* cited by examiner

*Primary Examiner*—Cuong Nguyen
(74) *Attorney, Agent, or Firm*—Blackwell Sanders Peper Martin, LLP

(57) ABSTRACT

The present invention is to provide a group III nitride tunneling junction structure with a low tunneling potential barrier, in which Si layer or a group III-V compound semiconductor In(a)Ga(b)Al(c)As(d)[N]P(e) ($0 \leqq a \leqq 1$, $0 \leqq b \leqq 1$, $0 \leqq c \leqq 1$, $0 \leqq d \leqq 1$, $0 \leqq e \leqq 1$) which has a smaller band gap than that of Al(x)Ga(y)In(z)N ($0 \leqq x \leqq 1$, $0 \leqq y \leqq 1$, $0 \leqq z \leqq 1$) and can be doped with a high concentration of p is inserted into a tunneling junction based on a $P^{++}$-Al(x)Ga(y)In(z)N ($0 \leqq x \leqq 1$, $0 \leqq y \leqq 1$, $0 \leqq z \leqq 1$) layer and a $N^{++}$-Al(x)Ga(y)In(z)N ($0 \leqq x \leqq 1$, $0 \leqq y \leqq 1$, $0 \leqq z \leqq 1$) layer. This tunneling junction structure will be useful for the fabrication of a highly reliable ultrahigh-speed optoelectronic device.

9 Claims, 2 Drawing Sheets

GAN-BASED SEMICONDUCTOR JUNCTION STRUCTURE

BACKGROUND OF INVENTION

The present invention relates to a new group-III nitride tunneling junction structure.

Generally, a tunneling phenomenon in highly doped P-N junction diodes has attracted many interests. Particularly, a tunneling phenomenon in GaAs-based devices which can be easily doped with a high concentration of P or N is frequently used in the fabrication of devices which have low resistance and low power consumption by using electric currents caused by electrons as a substitute for currents caused by holes with low mobility, because of good resistance in a reverse bias state. This has been discussed in "Buried tunnel contact junction AlGaAs-GaAs-InGaAs quantum well heterostructure lasers with oxide-defined lateral current", J. J. Wierer, etc, Appl. Phys. Lett. 71(16), pp. 2286–2288, October, 1997.

Also, InGaAs with low band gap can be interposed between p-n junctions, so that a tunneling potential barrier can be lowered, thus increasing tunneling probability. This phenomenon has been discussed in "High current density carbon-doped strained-layer GaAs(P+)-InGaAs(n+)-GaAs (n+) p-n tunnel diodes.", T. A. Richard, etc, Appl. Phys. Lett, 63(26), pp. 3616–3618, December, 1993.

In GaN-based nitride semiconductor devices (LED, LD, HBT, FET, HEMT, etc), the formation of low-resistance p-ohmic contacts necessary for improving the performance of the devices encounters many difficulties because of the low conductivity and large band gap of magnesium-doped p-GaN. In an attempt to overcome this problem, studies have been performed in order to reduce power consumption by inserting a reversely biased GaN p-n tunneling junction into a GaN-based LED. See U.S. Pat. No. 6,526,082, "P-contact for GaN-based semiconductors utilizing a reverse-biased tunnel junction". Also, there was an attempt to reduce a loss caused by a semi-transparent conductive film in LED, by using highly n-dopable GaN itself as the conductive film. See "Lateral current spreading in GaN-based LED utilizing tunnel contact junctions", Seong-Ran Jeon, etc., Appl. Phys. Lett. (78), 21, 3265–3267, May, 2001.

In order to realize an effective tunnel junction, high concentration doping must be possible first of all. In GaN, there were many efforts to increase the doping level of p-type GaN (e.g., p-type InGaN which is doped at a very high concentration, superlattice structure, and 3D grown GaN), but devices having the tunnel junction in GaN undergo a given tunneling barrier, thus causing an increase in operation voltage [Chih-Hsin Ko, etc, "P-dwon InGaN/GaN Multiple Quantum Wells Light emitting diode structure grown by metal-organic vapor phase epitaxy", Jpn. J. Appl. Phys. 41(2002) pp. 2489–2492]. However, since GaAs- or InP-based group III-V compound semiconductors can be easily doped with a high concentration of P, highly p-doped GaAs or graded p-type AlGaAs may be grown on a low concentration of P-GaN so as to lower the potential barrier, thus reducing resistance. See U.S. Pat. No. 6,410,944 issued to Song Jong In, "Epitaxial structure for low ohmic contact resistance in p-type GaN-based semiconductor."

Generally, in GaN-based optoelectronic devices, it is difficult to make an electrode with low contact resistance due to the large band gap and low conductivity of p-type GaN. On the other hand, in the case of n-type GaN, high concentration doping is possible and an electrode with good resistance characteristics can be easily formed thereon by plasma treatment, etc., without an annealing process. Thus, high power efficiency, high operation speed and high reliability can be ensured by electric currents caused by electrons with a higher mobility than that of holes, which flow by means of an electrode formed using the tunneling phenomenon of a P-N junction, other than hole currents flowing by means of an electrode formed directly on p-type GaN. A generally known GaN-based tunnel junction structure is shown in FIG. 1. In this case, in order to increase tunneling currents, a high concentration of an electron layer 12 (n>1019/cm3) and a high concentration of a hole layer 13 (p>1019/cm3) are required between the n-Al(x)Ga(y)In(z)N layer 14 and the p-Al(x)Ga(y)In(z)N layer 11. As the size of an electric field formed in a depletion layer produced at the junction between the two semiconductor layers increases, the tunneling currents increase. In addition, if a strained InGaN layer is added to the junction, a piezo-electric field will be formed at the junction and will have a positive function to increase the tunneling current. This is disclosed in U.S. Pat. No. 6,526,082, "P-contact for GaN-based semiconductors utilizing a reverse-biased tunnel junction."

In order to realize an effective tunnel junction, high concentration doping must be possible first of all. In GaN, there were many efforts to increase the doping level of P-GaN (e.g., p-type InGaN which is doped at a very high concentration, superlattice structure, and 3D grown GaN), but devices having the tunnel junction in GaN undergo a given tunneling barrier, thus causing an increase in operation voltage. See "P-dwon InGaN/GaN Multiple Quantum Wells Light emitting diode structure grown by metal-organic vapor phase epitaxy", Chih-Hsin Ko, et al, Jpn. J. Appl. Phys. 41(2002) pp. 2489–2492.

SUMMARY OF INVENTION

An object of the present invention is to provide a group-III nitride tunneling junction structure with a low tunneling potential barrier, in which Si layer or a group III-V compound semiconductor, In(a)Ga(b)Al(c)As(d)[N]P(e) ($0 \leqq a \leqq 1$, $0 \leqq b \leqq 1$, $0 \leqq c \leqq 1$, $0 \leqq d \leqq 1$, $0 \leqq e \leqq 1$), which has a smaller band gap than that of Al(x)Ga(y)In(z)N ($0 \leqq x \leqq 1$, $0 \leqq y \leqq 1$, $0 \leqq z \leqq 1$) and can be doped with a high concentration of p is inserted into a tunneling junction based on a p-type Al(x)Ga(y)In(z)N ($0 \leqq x \leqq 1$, $0 \leqq y \leqq 1$, $0 \leqq z \leqq 1$) layer which is doped at a very high concentration and a n-type Al(x)Ga(y)In(z)N ($0 \leqq x \leqq 1$, $0 \leqq y \leqq 1$, $0 \leqq z \leqq 1$) layer which is doped at a very high concentration. This tunneling junction structure will be useful for the fabrication of a highly reliable ultrahigh-speed optoelectronic device.

According to the present invention, a tunneling junction structure with a low tunneling potential barrier can be realized using GaN and Si layer or a group III-V compound semiconductor, In(a)Ga(b)Al(c)As(d)[N]P(e) ($0 \leqq a \leqq 1$, $0 \leqq b \leqq 1$, $0 \leqq c \leqq 1$, $0 \leqq d \leqq 1$, $0 \leqq e \leqq 1$), which can be doped with a high concentration of P. Furthermore, p-GaN contact resistance can be reduced. As a result, the high power efficiency, high reliability and ultrahigh speed operation of GaN-based nitride optoelectronic devices can be achieved.

It should be understood that the drawings are not necessarily to scale and that the embodiments are sometimes illustrated by graphic symbols, phantom lines, diagrammatic representations and fragmentary views. In certain instances, details which are not necessary for an understanding of the present invention or which render other details difficult to perceive may have been omitted. It should be understood, of course, that the invention is not necessarily limited to the particular embodiments illustrated herein. Like numbers utilized throughout the various Figures designate like or similar parts.

DETAILED DESCRIPTION

Figure 1:
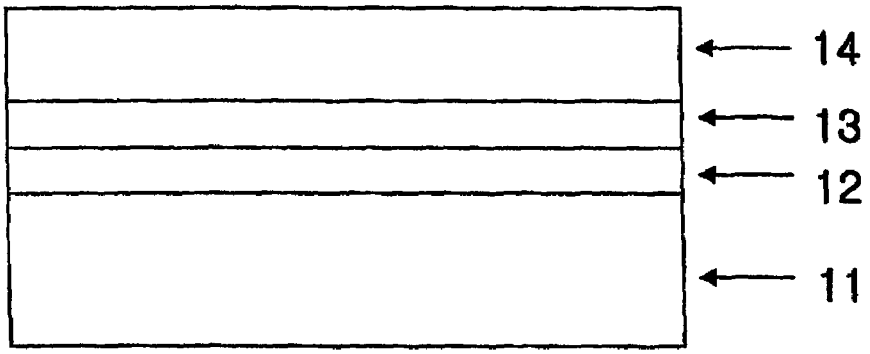
FIG. 1 shows a tunneling junction structure according to a prior art.
Figure 2:
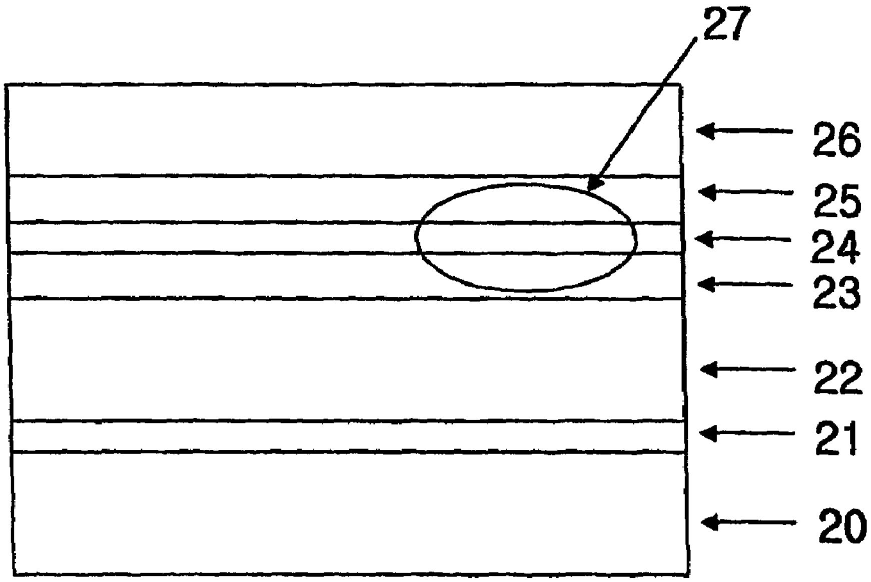
FIG. 2 shows a tunneling junction structure according to the present invention, in which a highly P-doped InGaAlAsP layer is inserted.

FIG. 2 shows a group-III nitride tunneling junction structure according to the present invention. As shown in FIG. 2, the group III-V compound semiconductor, In(a)Ga(b)Al(c)As(d)[N]P(e) (0≦a≦1, 0≦b≦1, 0≦c≦1, 0≦d≦1, 0≦e≦1) layer 24, which has a smaller band gap than that of Al(x)Ga(y)In(z)N (0≦x≦1, 0≦y≦1, 0≦z≦1) and can be doped with a high concentration of p is inserted into a tunneling junction based on the p-type Al(x)Ga(y)In(z)N (0≦x≦1, 0≦y≦1, 0≦z≦1) layer 23 and the n-type Al(x)Ga(y)In(z)N (0≦x≦1, 0≦y≦1, 0≦z≦1) layer 25, which are doped at a very high concentration, thus realizing a tunneling junction structure with a low tunneling potential barrier. The In(a)Ga(b)Al(c)As(d)[N]P(e) (0≦a≦1, 0≦b≦1, 0≦c≦1, 0≦d≦1, 0≦e≦1) layer 24 means a compound semiconductor, such as GaAs, InGaAs, AlGaAs, InP, InGaAsP, InAlAs, InGaP, GaP, or InGaNAs, and a Si layer may also be used as the insertion layer 24. Although FIG. 2 shows the buffer layer 21 formed on the substrate 20, and the tunneling junction 27 between the p-type Al(x)Ga(y)In(z)N (0≦x≦1, 0≦y≦1, 0≦z≦1) layer 22 formed on the buffer layer 21 and the n-type Al(x)Ga(y)In(z)N (0≦x≦1, 0≦y≦1, 0≦z≦1) layer 26, the present invention is not limited thereto. For example, between the buffer layer 21 and the p-type Al(x)Ga(y)In(z)N (0≦x≦1, 0≦y≦1, 0≦z≦1) layer 22, a light-emitting portion including an active layer containing Ga and N may be additionally included.

Figure 3:
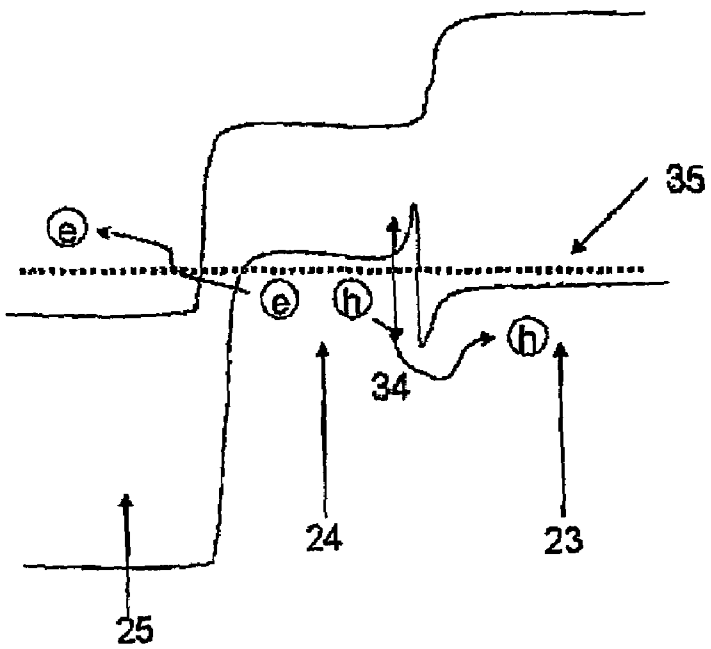
FIG. 3 is an energy band diagram.

The general energy band diagram of the tunneling junction structure shown in FIG. 2 is shown in FIG. 3. As shown in FIG. 3, the insertion of the highly p-doped In(a)Ga(b)Al(c)As(d)[N]P(e) (0≦a≦1, 0≦b≦1, 0≦c≦1, 0≦d≦1, 0≦e≦1) or Si layer 24 provides a lowering in tunneling potential barrier height. Also, a barrier 34 is created by the discontinuity between the p-type In(a)Ga(b)Al(c)As(d)[N]P(e) (0≦a≦1, 0≦b≦1, 0≦c≦1, 0≦d≦1, 0≦e≦1) or Si layer 24 and the p-type Al(x)Ga(y)In(z)N (0≦x≦1, 0≦y≦1, 0≦z≦1) layer 23 which is doped at a very high concentration. This barrier 34 varies depending on the compositions of the p-type In(a)Ga(b)Al(c)As(d)[N]P(e) (0≦a≦1, 0≦b≦1, 0≦c≦1, 0≦d≦1, 0≦e≦1) layer 24 and the p-type Al(x)Ga(y)In(z)N (0≦x≦1, 0≦y≦1, 0≦z≦1) layer 23 which is doped at a very high concentration. For example, in the case of GaAs/GaN, the size of the barrier 34 is about 1.9 eV. In order to reduce this effect of the barrier 34, graded p-type AlGaAs may also be introduced in U.S. Pat. No. 6,410,944 issued to Song Jong In, "Epitaxial structure for low ohmic contact resistance in p-type GaN-based semiconductor." By the electron tunneling phenomenon between the highly doped p-type In(a)Ga(b)Al(c)As(d)[N]P(e) (0≦a≦1, 0≦b≦1, 0≦c≦1, 0≦d≦1, 0≦e≦1) or Si layer 24 and the n-type Al(x)Ga(y)In(z)N (0≦x≦1, 0≦y≦1, 0≦z≦1) layer 25, electric currents flow. These electric currents caused by electrons create electric currents caused by holes, thus allowing holes to be supplied to the highly doped p-type Al(x)Ga(y)In(z)N (0≦x≦1, 0≦y≦1, 0≦z≦1) layer 23. Since the highly doped n-type Al(x)Ga(y)In(z)N (0≦x≦1, 0≦y≦1, 0≦z≦1) or superlattice structure layer 25 made of high doped n-type Al(x)Ga(y)In(z)N (0≦x≦1, 0≦y≦1, 0≦z≦1) can be doped at a high concentration of more than $10^{20}/cm^3$), the tunneling barrier between the p-type In(a)Ga(b)Al(c)As(d)[N]P(e) (0≦a≦1, 0≦b≦1, 0≦c≦1, 0≦e≦1, 0≦f≦1) or Si layer 24 and the highly doped n-type Al(x)Ga(y)In(z)N (0≦x≦1, 0≦y≦1, 0≦z≦1) layer 25 can be very lowered. In FIG. 3, the dotted line 35 denotes the Fermi-level in an equilibrium state.

Figure 4:
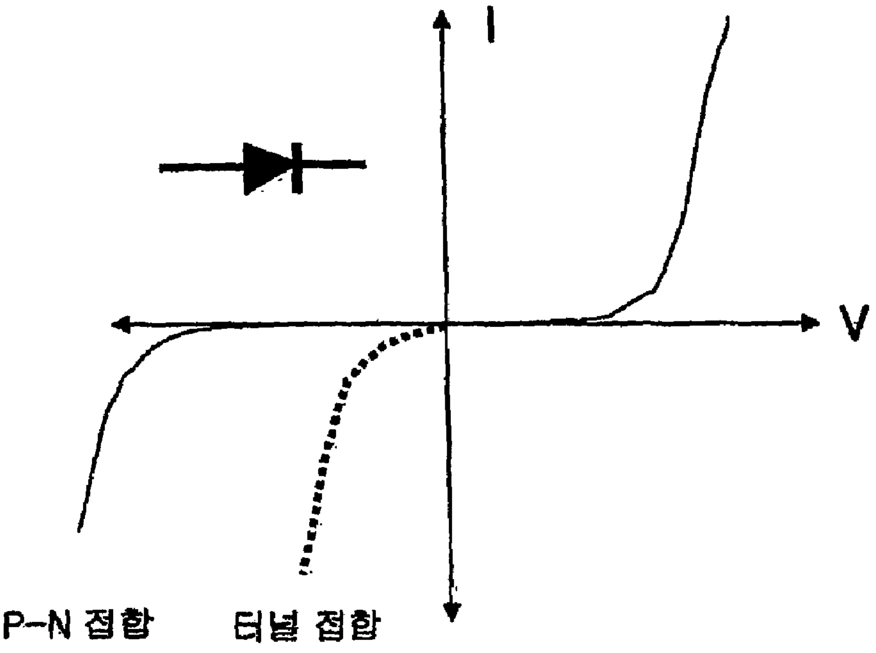
FIG. 4 shows the current-voltage curve of each of a GaN-based P-N junction structure and a tunneling junction structure.

FIG. 4 shows the current-voltage curve of a GaN-based P-N junction. As shown in FIG. 4, if reverse voltage is applied, the P-N junction will undergo a high potential barrier so that currents will not substantially flow. However, when the tunneling junction structure is inserted into the P-N junction, electric currents can flow well with only a low potential barrier, even if reverse voltage is applied.

Preferably, the highly doped p-type In(a)Ga(b)Al(c)As(d)[N]P(e) (0≦a≦1, 0≦b≦1, 0≦c≦1, 0≦d≦1, 0≦e≦1) layer or highly doped p-type Si layer 24 has a concentration of $10^{18}$–$10^{23}/cm^3$.

Preferably, the highly doped p-type In(a)Ga(b)Al(c)As(d)[N]P(e) (0≦a≦1, 0≦b≦1, 0≦c≦1, 0≦d≦1, 0≦e≦1) layer or highly doped p-type Si layer 24 has a thickness of 1–100 nm.

The invention claimed is:

1. A GaN-based semiconductor junction structure comprising:

a buffer on a substrate, a lower p-type Al(x)Ga(y)In(z)N (0≦x≦1, 0≦y≦1, 0≦z≦1) layer, a p-type Al(x)Ga(y)In(z)N (0≦x≦1, 0≦y≦1, 0≦z≦1) layer which is doped at a very high concentration, a p-type In(a)Ga(b)Al(c)As(d)[N]P(e) (0≦a≦1, 0≦b≦1, 0≦c≦1, 0≦d≦1, 0≦e≦1) layer which is doped at a very high concentration, an n-type Al(x)Ga(y)In(z)N (0≦x≦1, 0≦y≦1, 0≦z≦1) layer which is doped at a very high concentration, and an n-type Al(x)Ga(y)In(z)N (0≦x≦1, 0≦y≦1, 0≦z≦1) layer.

2. The GaN-based semiconductor junction structure of claim 1, wherein the p-type Al(x)Ga(y)In(z)N (0≦x≦1, 0≦y≦1, 0≦z≦1) layer is a superlattice structure layer made of p-type Al(x)Ga(y)In(z)N (0≦x≦1, 0≦y≦1, 0≦z≦1) which is doped at a very high concentration.

3. The GaN-based semiconductor junction structure of claim 1, wherein the p-type In(a)Ga(b)Al(c)As(d)[N]P(e) (0≦a≦1, 0≦b≦1, 0≦c≦1, 0≦d≦1, 0≦e≦1) layer which is doped at a very high concentration is selected from a group consisting of GaAs, InGaAs, AlGaAs, InP, InGaAsP, InAlAs, InGaP, GaP, and InGaNAs.

4. The GaN-based semiconductor junction structure of claim 1, wherein the p-type In(a)Ga(b)Al(c)As(d)[N]P(e) (0≦a≦1, 0≦b≦1, 0≦c≦1, 0≦d≦1, 0≦e≦1) layer has a concentration of $10^{18}$–$10^{23}/cm^3$.

5. A GaN-based semiconductor junction structure as set forth in claim 1, wherein the p-type In(a)Ga(b)Al(c)As(d)[N]P(e) (0≦a≦1, 0≦b≦1, 0≦c≦1, 0≦d≦1, 0≦e≦1) layer has a thickness of 1–100 nm.

6. A GaN-based semiconductor junction structure comprising:

a buffer on a substrate, a lower p-type Al(x)Ga(y)In(z)N ($0 \leqq x \leqq 1$, $0 \leqq y \leqq 1$, $0 \leqq z \leqq 1$) layer, a p-type Al(x)Ga(y)In(z)N ($0 \leqq x \leqq 1$, $0 \leqq y \leqq 1$, $0 \leqq z \leqq 1$) layer which is doped at a very high concentration, a p-type Si layer which is doped at a very high concentration, an n-type Al(x)Ga(y)In(z)N ($0 \leqq x \leqq 1$, $0 \leqq y \leqq 1$, $0 \leqq z \leqq 1$) layer which is doped at a very high concentration, and an n-type Al(x)Ga(y)In(z)N ($0 \leqq x \leqq 1$, $0 \leqq y \leqq 1$, $0 \leqq z \leqq 1$) layer.

7. A GaN-based semiconductor junction structure as set forth in claim 6, wherein the p-type Al(x)Ga(y)In(z)N ($0 \leqq x \leqq 1$, $0 \leqq y \leqq 1$, $0 \leqq z \leqq 1$) layer is a superlattice structure layer made of p-type Al(x)Ga(y)In(z)N ($0 \leqq x \leqq 1$, $0 \leqq y \leqq 1$, $0 \leqq z \leqq 1$) which is doped at a very high concentration.

8. A GaN-based semiconductor junction structure as set forth in claim 6, wherein the p-type Si layer has a concentration of $10^{18}$–$10^{23}$/cm$^3$.

9. A GaN-based semiconductor junction structure as set forth in claim 6, wherein the p-type Si layer has a thickness of 1–100 nm.

* * * * *